(12) United States Patent
Wieczorek et al.

(10) Patent No.: US 7,297,994 B2
(45) Date of Patent: Nov. 20, 2007

(54) SEMICONDUCTOR DEVICE HAVING A RETROGRADE DOPANT PROFILE IN A CHANNEL REGION

(75) Inventors: Karsten Wieczorek, Dresden (DE); Manfred Horstmann, Dresden (DE); Rolf Stephan, Dresden (DE)

(73) Assignee: Advanced Micro Devices, Inc., Austin, TX (US)

( * ) Notice: Subject to any disclaimer, the term of this patent is extended or adjusted under 35 U.S.C. 154(b) by 491 days.

(21) Appl. No.: 11/072,142

(22) Filed: Mar. 4, 2005

(65) Prior Publication Data

US 2005/0151202 A1 Jul. 14, 2005

Related U.S. Application Data

(62) Division of application No. 10/282,980, filed on Oct. 29, 2002, now Pat. No. 6,881,641.

(30) Foreign Application Priority Data

Mar. 28, 2002 (DE) ................................ 102 14 066

(51) Int. Cl.
*H10L 29/00* (2006.01)
*H01L 29/80* (2006.01)
(52) U.S. Cl. ................ 257/285; 257/607; 257/E21.485; 257/E21.135
(58) Field of Classification Search ................ 257/285, 257/607, E21.466, E21.135
See application file for complete search history.

(56) References Cited

U.S. PATENT DOCUMENTS 6,127,232 A  10/2000 Chatterjee et al. .......... 438/291
6,160,300 A * 12/2000 Gardner et al. .............. 257/412
6,180,978 B1   1/2001 Chatterjee et al. .......... 257/327
6,310,367 B1  10/2001 Yagishita et al. ........... 257/190
2002/0190322 A1  12/2002 Mouli ........................ 257/347

FOREIGN PATENT DOCUMENTS

EP     0 762 499 A1    3/1997
EP     0 838 858 B1    5/2002
JP     08293557        5/1996

* cited by examiner

*Primary Examiner*—Long K. Tran
(74) *Attorney, Agent, or Firm*—Williams, Morgan & Amerson, P.C.

(57) ABSTRACT

An epitaxially grown channel layer is provided on a well structure after ion implantation steps and heat treatment steps are performed to establish a required dopant profile in the well structure. The channel layer may be undoped or slightly doped, as required, so that the finally obtained dopant concentration in the channel layer is significantly reduced compared to a conventional device to thereby provide a retrograde dopant profile in a channel region of a field effect transistor. Additionally, a barrier diffusion layer may be provided between the well structure and the channel layer to reduce up-diffusion during any heat treatments carried out after the formation of the channel layer. The final dopant profile in the channel region may be adjusted by the thickness of the channel layer, the thickness and the composition of the diffusion barrier layer and any additional implantation steps to introduce dopant atoms in the channel layer.

11 Claims, 5 Drawing Sheets

SEMICONDUCTOR DEVICE HAVING A RETROGRADE DOPANT PROFILE IN A CHANNEL REGION

CROSS-REFERENCE TO RELATED APPLICATION

This is a divisional of application Ser. No. 10/282,980, filed Oct. 29, 2002, now U.S. Pat. No. 6,881,641.

BACKGROUND OF THE INVENTION

1. Field of the Invention

Generally, the present invention relates to the field of manufacturing integrated circuits, and, more particularly, to a semiconductor device, such as a field effect transistor, having an improved retrograde dopant profile in a channel region of the transistor element, and a method of manufacturing such a semiconductor device.

2. Description of the Related Art

Field effect transistors, such as MOS transistors, represent one of the most frequently used circuit elements in modern integrated circuits. Typically, a huge number of field effect transistors is simultaneously formed on an appropriate substrate and are connected to provide the required functionality of the circuit. Generally, a field effect transistor comprises two highly doped semiconductor regions, commonly silicon regions, that are also referred to as drain and source regions, and which are embedded in a lightly and inversely doped semiconductor region, the so-called N-well or P-well, depending on the type of transistor to be formed. The drain and source regions are spaced apart with a channel region interposed, wherein a conductive channel forms between the drain and source regions in the channel region upon application of an appropriate voltage to a gate electrode that is usually formed over the channel region and is separated therefrom by a gate insulation layer, often provided as a gate oxide layer.

As feature sizes of the individual semiconductor elements are steadily decreasing, for example, the distance between the source and drain regions (also referred to as the channel length) represents a critical dimension in this respect, device performance increases. However, these changes present new challenges to be overcome by process engineers so as to develop new processes and techniques compatible with the decreased feature sizes that do not partially offset the improvements obtained by decreasing the feature sizes. For instance, reducing the channel length generally requires the reduction of the thickness of the gate insulation layer so that the formation of the conductive channel remains sufficiently controllable by the applied gate voltage. Forming a gate insulation layer of a few nanometers in thickness, as is typical for sophisticated MOS transistors, therefore requires an advanced process technology to minimize any lattice damage in the semiconductor region underlying the gate insulation layer so as to allow formation of a high quality gate insulation layer, such as an oxide layer, for guaranteeing a high degree of reliability of the device over the whole operating life. Moreover, only a relatively intact semiconductor region allows the formation of a gate insulation layer having a relatively smooth interface with the semiconductor material so that scattering events of charge carriers are minimized.

A reduction of the channel length in modern devices leads to an improved conductivity. However, in some cases, it may be desirable to further improve the conductivity by enhancing carrier mobility in the channel region without excessively decreasing the channel length. Accordingly, in modern devices, a so-called retrograde channel doping profile is contemplated. As is well known, dopant atoms in the semiconductor lattice may represent scattering centers for charge carriers moving under the influence of an electrical field prevailing in the semiconductor region. Therefore, in modern devices, the retrograde channel dopant profile may be used, that is, the concentration of dopants increases from the gate insulation layer to the areas located deeper down the channel region, so that charge carriers forming the conductive channel essentially in the vicinity of the gate insulation layer encounter a relatively low concentration of scattering centers so that the overall conductivity in the channel is enhanced. A retrograde channel dopant profile, however, is very difficult to obtain as will be detailed in the following by referring to FIGS. 1a-1c and FIGS. 2a-2b.

FIG. 1a shows a schematic cross-sectional view of a semiconductor element 100 at an early manufacturing stage. The semiconductor element 100 is illustrated in this example as a complementary MOS transistor pair, wherein a semiconductor region 101, such as a silicon region, a shallow trench isolation 102, for example comprising silicon dioxide, is formed to separate an N-well structure 120 and a P-well structure 110. In the N-well structure 120, implanted, i.e., doped, portions are indicated by 121, 122, 123 and 124, and correspondingly, in the P-well structure 110, implanted portions 111, 112, 113 and 114 are illustrated. The implantation portions 111, 121 located lowest in the N-well structure 120 and the P-well structure 110 are also referred to as buried implants. The implanted portions 112, 122 are commonly known as fill implants, whereas the implanted portions 113, 123 are usually referred to as punch-through implants. The implanted portions 114, 124 are also called $V_T$ implants, wherein $V_T$ indicates the threshold voltage of the transistor elements to be formed.

A typical process flow for forming the semiconductor device 100 shown in FIG. 1a may comprise the following steps. First, the shallow trench isolation 102 is formed by photolithography, etching and deposition techniques that are well known in the art. Thereafter, the P-well structure 110 and the N-well structure 120 are defined by sequentially performed ion implantation processes, wherein, prior to the actual implantation process, a sacrificial layer, such as an oxide layer (not shown), may be deposited over the semiconductor region 101 to more precisely control the implantation process. For defining the N-well structure 120, typically phosphorous or arsenic ions are used, whereas for defining the P-well structure 110, typically boron ions are employed. During implantation, the dose and the energy of the respective implantation process is controlled so as to locate the peak concentration of the corresponding ion species in the respective implantation portions 121 to 124 and 111 to 114. It should be noted that due to the nature of the implantation process, the boundaries of the implantation portions for defining the P-well structure 110 and the N-well structure 120 are not sharp boundaries as shown in FIG. 1a but, instead, have gradual transitions.

FIG. 2a is a graph, in which the dopant concentration of the N-well structure 120 and the P-well structure 110 is depicted with respect to the depth in the respective well structures. In particular, it is evident from FIG. 2a that the $V_T$ implantation (114, 124), indicated by the same reference number as the respective implantation portions, leads to a dopant concentration that significantly decreases at the vicinity of the surface of the semiconductor device 100. That is, the dopant concentration immediately after the implantation process exhibits a desired retrograde dopant profile in the N-well structure 120 and the P-well structure 110 near the surface of the semiconductor device 100, where, after completion of the device, a channel will form during operation of the device.

After defining the P-well structure 110 and the N-well structure 120 by ion implantation, the semiconductor device 100 has to be subjected to a heat treatment so as to activate the implanted ions, that is, to locate the majority of the ions at lattice sites, and to cure any lattice damage caused by the ion bombardment. Unfortunately, during this heat treatment, an inevitable diffusion takes place and the boundaries between the respective implantation portions will smear out more intensively so that the vertical dopant profile within the P-well structure 110 and the N-well structure 120 will become more indefinite.

FIG. 2b shows a corresponding graph with a typical dopant profile with respect to the depth of the respective well structure. Due to the up-diffusion of the dopant atoms during the heat treatment, the initially retrograde profile in the vicinity of the surface of the semiconductor device 100, as indicated by reference number 200, may have become substantially uniformly distributed.

FIG. 1b schematically shows the semiconductor device 100 in an advanced manufacturing stage. In FIG. 1b, the semiconductor device 100 comprises within the P-well structure 110 heavily N-doped source and drain regions 131, including lightly doped extensions 132. In the N-well structure 120, similarly, heavily P-doped source and drain regions 141, including lightly doped extensions 142, are provided. A gate insulation layer 135, for example, a gate oxide layer, is provided on the entire surface of the semiconductor device 100 to separate a gate electrode 134 from a corresponding channel region 136 and a gate electrode 144 from the corresponding channel region 146. Spacer elements 133 are provided at the sidewalls of the gate electrode 134 and respective spacer elements 143 are located at the sidewalls of the gate electrode 144. Thus, the semiconductor device 100 includes an N-channel transistor 130 and a P-channel transistor 140.

Typically, the N-channel transistor 130 and the P-channel transistor 140 are formed by the following processes. After the heat treatment, the gate insulation layer 135 is formed, wherein the gate insulation layer may be deposited by chemical vapor deposition (CVD), or, if an oxide layer is used, a rapid thermal furnace process or a conventional furnace oxidation process may be used. Since, commonly, elevated temperatures are involved in fabricating the gate insulation layer 135, this process also contributes to a further diffusion of the dopants within the P-well structure 110 and the N-well structure 120. Thereafter, polysilicon is deposited and patterned by sophisticated photolithography techniques to form the gate electrodes 134 and 144. With a first implantation, the extensions 132 and 142 are defined, and, subsequently, the spacer elements 133, 143 are formed and serve as an implantation mask during a subsequent implantation process for defining the source and drain regions 131, 141. Since a further heat treatment is necessary to activate the dopants within the regions 131, 132 and 141, 142 and to cure any crystal damage caused by the preceding implantation steps, the initial dopant concentration, as shown in FIG. 2a, will be even more strongly affected so that, after the plurality of heat treatments, the actual dopant concentration will be represented by the graph shown in FIG. 2b. In particular, it is thus very difficult to obtain or to maintain a retrograde dopant profile in the channel regions 136 and 146, which would be desirable to achieve an improved carrier mobility therein.

According to the difficulties involved in obtaining or maintaining a retrograde dopant profile in the channel region of a field effect transistor caused by the conventional process flow, there is a strong need for an improved method for forming semiconductor devices exhibiting a retrograde dopant profile.

SUMMARY OF THE INVENTION

The present invention is generally directed to a method for forming a semiconductor device including a retrograde dopant profile, wherein a substantially mono-crystalline channel layer is formed after a well structure has been defined by ion implantation in a semiconductor region. Since the ion implantation, as well as the subsequent heat treatment processes, are performed prior to the formation of the channel layer, which will substantially accommodate the channel region of the semiconductor device to be formed, diffusion of dopant atoms from the well structure into the channel layer is significantly reduced. Since the channel layer may be undoped or merely lightly doped, a substantially retrograde dopant profile in this channel layer may be maintained throughout the following process steps, thereby ensuring improved device characteristics in terms of enhanced carrier mobility and improved quality of the gate insulation layer due to a reduced dopant concentration at the interface to the underlying channel layer.

According to one illustrative embodiment of the present invention, a method of forming a retrograde dopant profile in a channel region of a field effect transistor comprises forming a well structure formed in a substrate and epitaxially growing a channel layer over the well structure. Moreover, a gate insulation layer followed by a gate electrode are formed on the channel layer. Additionally, the method includes forming a drain and source region in the well structure, wherein the channel region is located therebetween.

In a further embodiment of the present invention, a method of selectively forming a retrograde dopant profile in a semiconductor region formed on a substrate comprises forming a first well structure in a first portion of the semiconductor region and forming a second well structure in a second portion of the semiconductor region. Moreover, a mask layer is formed over the second well structure and a channel layer is selectively epitaxially grown over the first well structure, wherein the mask layer prevents the growth of the channel layer on the second well structure.

According to a further embodiment of the present invention, a semiconductor device comprises a transistor element that comprises a well structure formed in a substrate and a diffusion barrier layer formed on the well structure. Moreover, a channel layer is formed on the diffusion barrier layer and a gate insulation layer is formed on the channel layer. The transistor element further comprises a gate electrode formed on the gate insulation layer and a source and a drain region that are separated by a channel region. A dopant concentration of the channel region that is located within the channel layer increases from the gate insulation layer towards the diffusion barrier layer.

BRIEF DESCRIPTION OF THE DRAWINGS

The invention may be understood by reference to the following description taken in conjunction with the accompanying drawings, in which like reference numerals identify like elements, and in which.

Figure 1A:
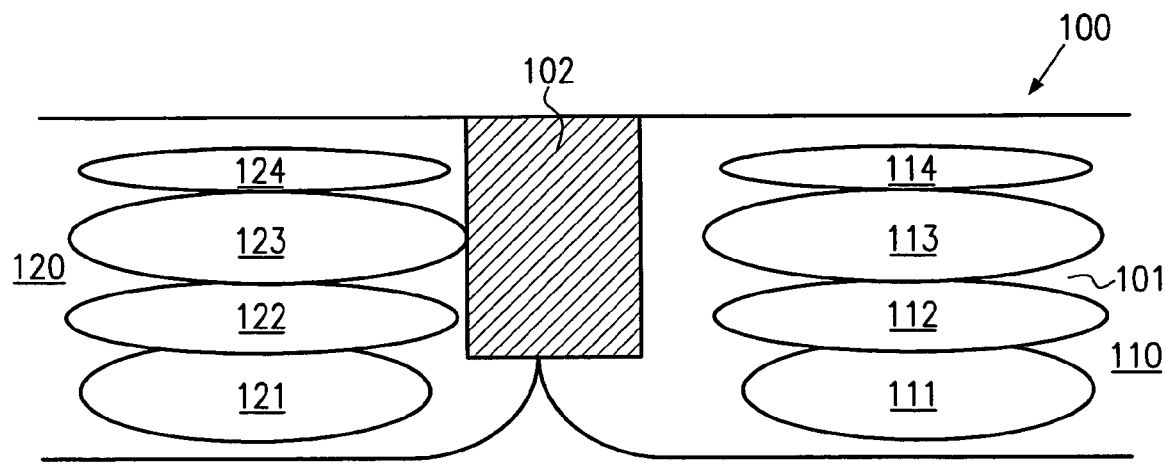
FIGS. 1a-1b show schematic cross-sectional views of an exemplary conventional semiconductor device at different manufacturing stages.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

Figure 3A:
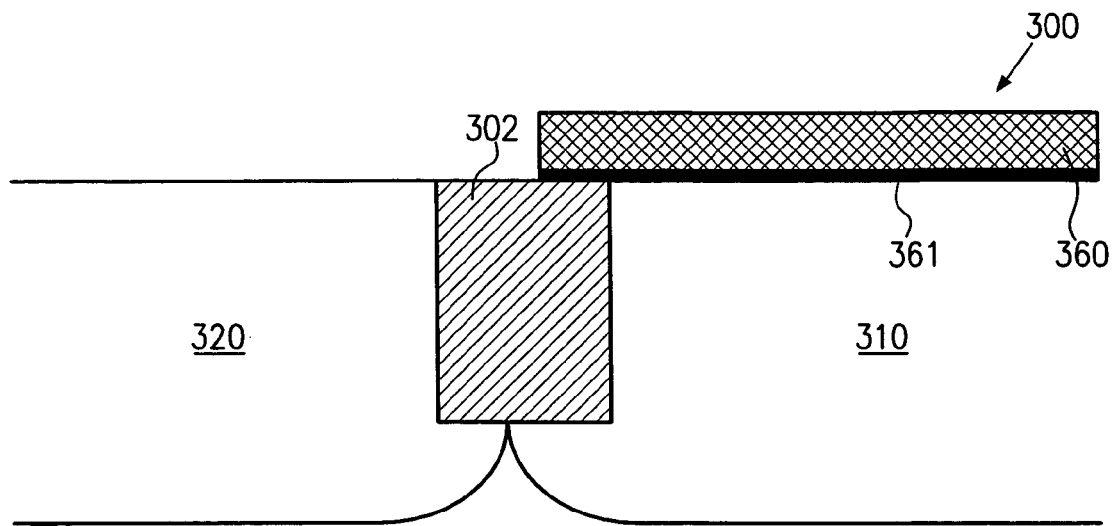
FIGS. 3a-3f schematically show cross-sectional views of a semiconductor device at various manufacturing stages in accordance with illustrative embodiments of the present invention.
Figure 3B:
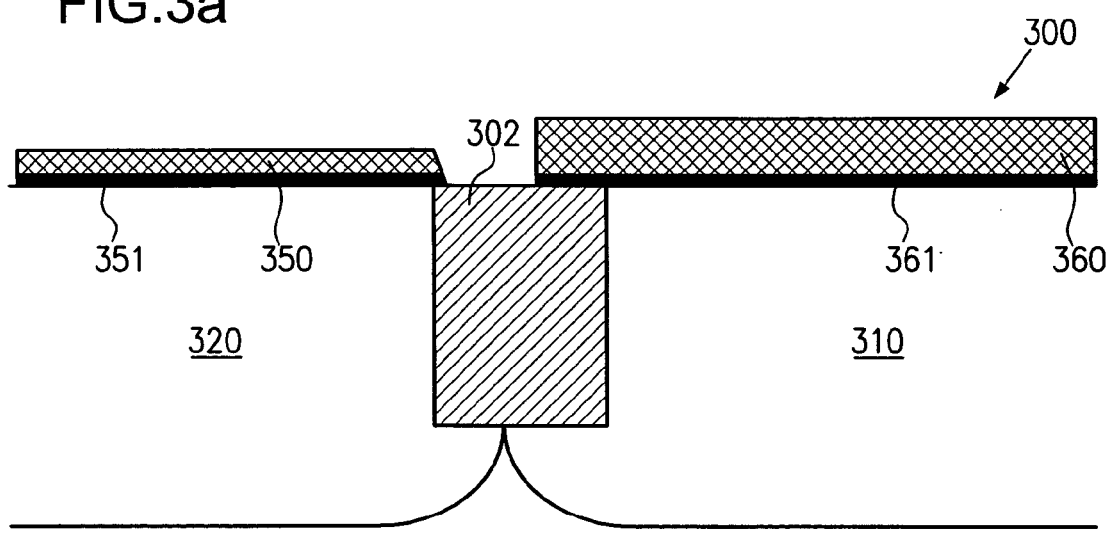
Figure 3C:
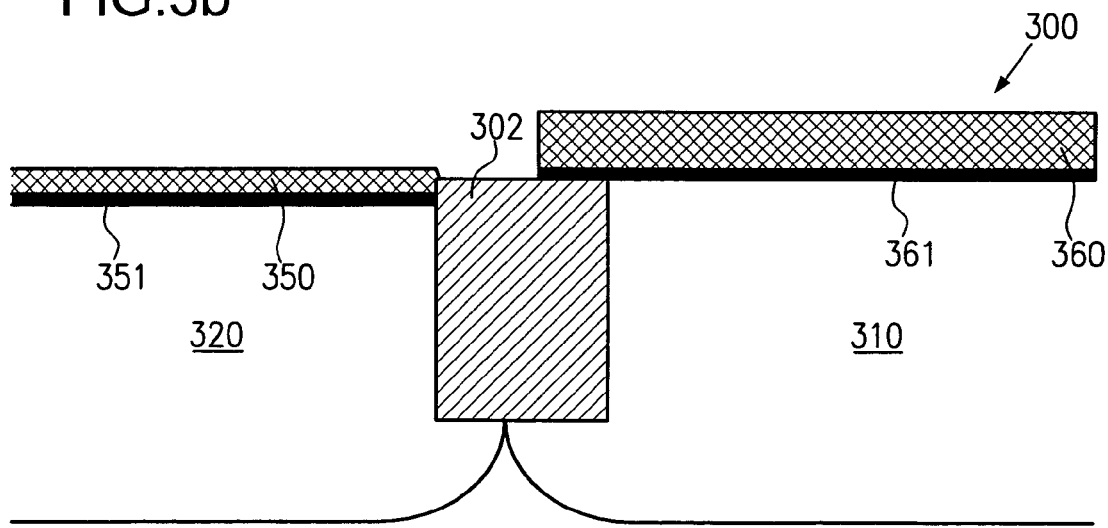
Figure 3D:
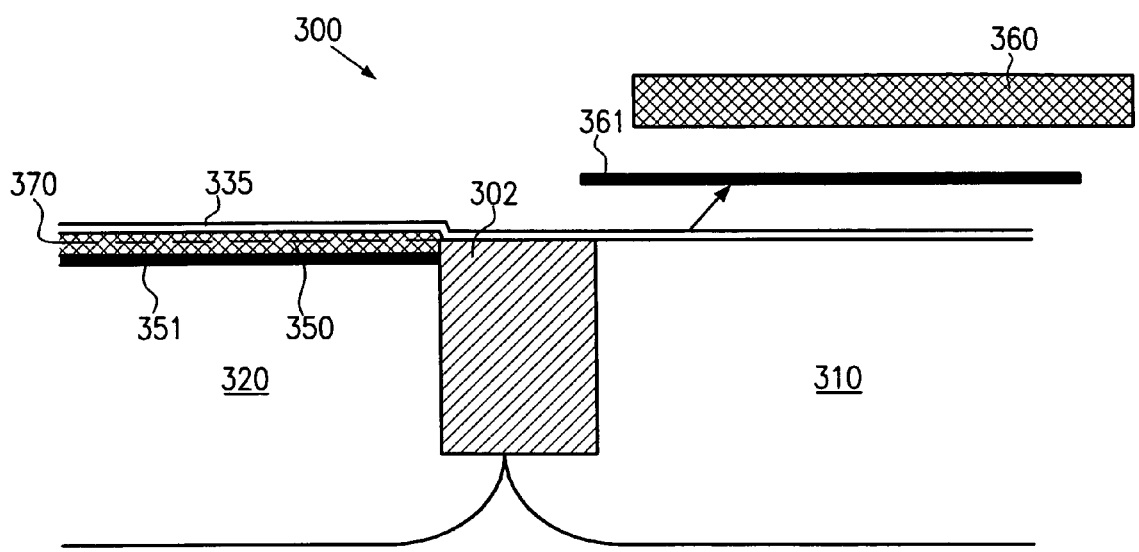
Figure 3E:
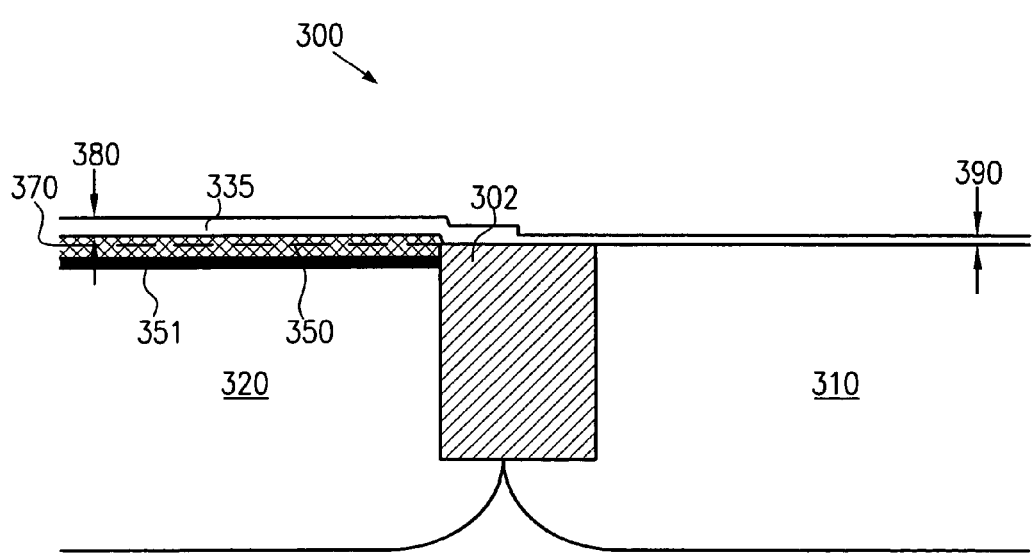
Figure 3F:
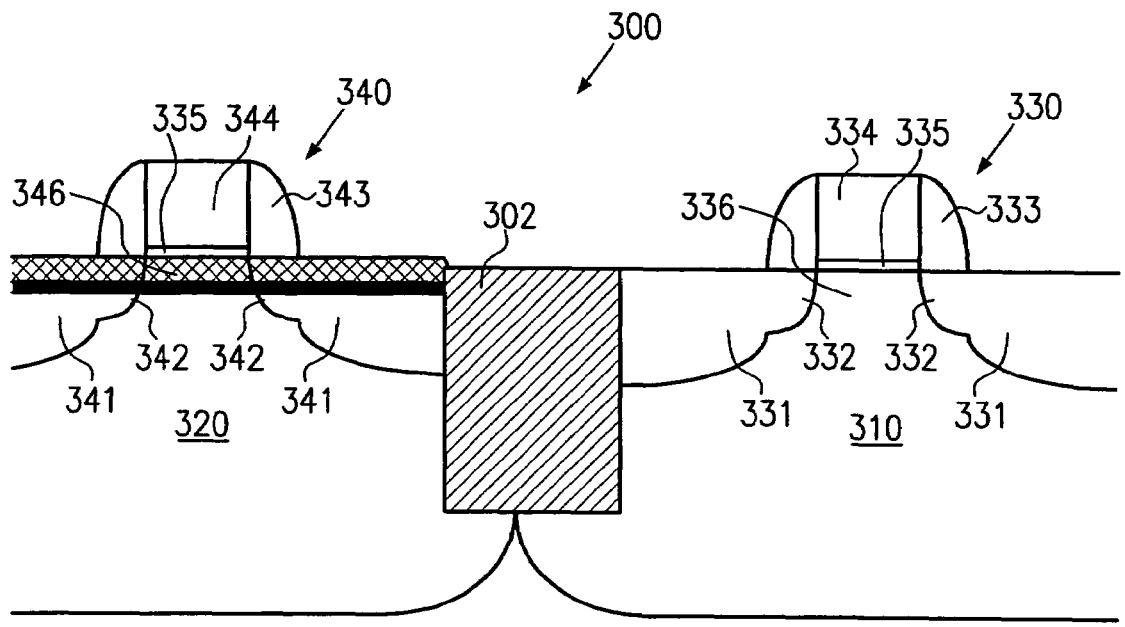
Figure 4:
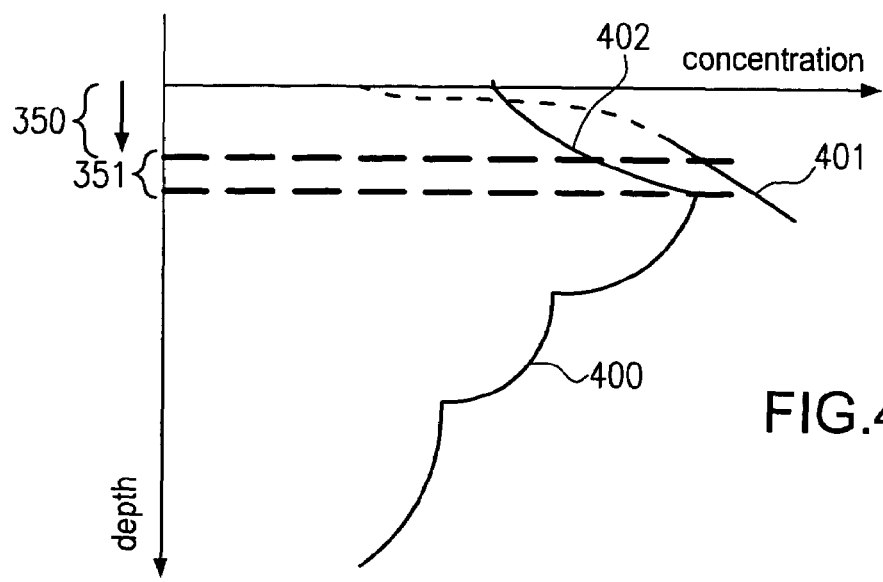
FIG. 4 schematically depicts a graph illustrating the vertical concentration within the well structure including a channel region having a retrograde dopant profile.

With reference to FIGS. 3 and 4, illustrative embodiments of the present invention will now be described. In these embodiments, a complementary MOS transistor pair is illustrated as the semiconductor device, as is the case in the "Description of the Related Art," since a complementary MOS transistor pair, including a P-channel MOSFET and an N-channel MOSFET, is a frequently used semiconductor device in modern integrated circuits. Typically, the P-channel MOS transistor exhibits a reduced performance compared to the N-channel MOS transistor due to the significantly decreased mobility of the positive holes in the P-channel of the P-channel MOS transistor. Thus, the illustrative embodiments depicted in FIGS. 3a-3e represent the application of the present invention on a P-channel MOS transistor, which may therefore allow one to at least partially compensate for the reduced performance of the P-channel MOS transistor compared to the N-channel MOS transistor. The characteristics of the N-channel MOS transistor remain substantially unaltered so that a high degree of symmetry in the electrical characteristics of the N-channel transistor and the P-channel transistor may be obtained. It is to be understood, however, that the present invention is also applicable to N-channel transistors or to both P-channel transistors and N-channel transistors.

Figures 2A, 2B:
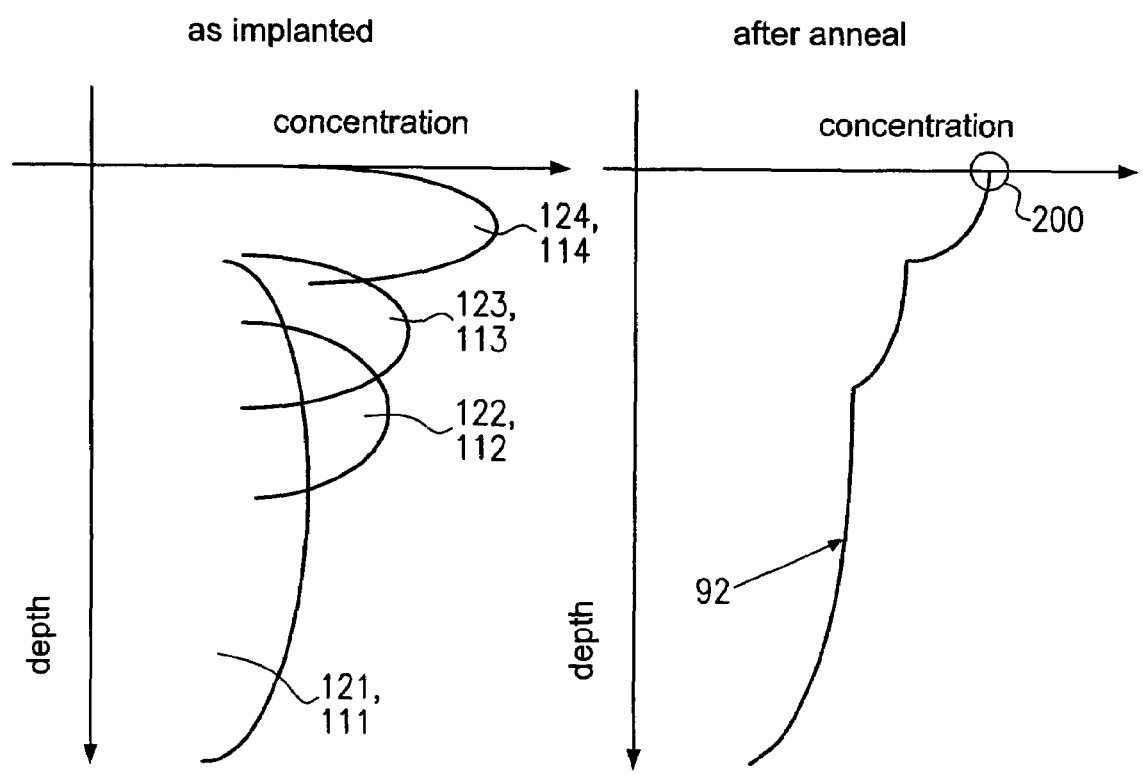
FIGS. 2a-2b schematically depict a vertical dopant concentration within a well structure of the semiconductor device of FIGS. 1a-1b after the implantation process and after a plurality of heat treatment steps.

FIG. 3a schematically shows a cross-sectional view of a semiconductor device 300 comprising a P-well structure 310 and an N-well structure 320 formed in a semiconductor substrate 301. It is to be noted that the substrate 301 may be any suitable substrate for forming thereon a semiconductor region, in which the P-well and N-well structures 310, 320 may be formed. It is, therefore, intended that the semiconductor substrate 301 is to enclose any substrate, for example comprising an insulating material, such as sapphire, glass and the like, on or in which a suitable semiconductor region is formed to allow the formation of the corresponding well structures 310 and 320. Moreover, the semiconductor device 300 comprises a shallow trench isolation 302 including an insulation material, such as silicon dioxide, to separate the P-well structure 310 and the N-well structure 320. The P-well structure 310 and the N-well structure 320 both comprise respective dopants arranged within the respective well structures so as to result in an exemplary vertical (with respect to the drawing) dopant concentration as is shown, for example, in FIG. 2a. For example, the P-well structure 310 may comprise boron atoms and the N-well structure 320 may comprise phosphorous and/or arsenic atoms to provide for the required conductivity. Moreover, a mask layer 360 is formed above the P-well structure 310, wherein the mask layer may comprise an insulating material, such as silicon dioxide, silicon nitride and silicon-reacted nitride, etc. The material of the mask layer 360 should exhibit a good etching selectivity with respect to the semiconductor material and to the insulating material of the shallow trench isolation 302. For example, if silicon is the semiconductor material in the P-well structure 310 and N-well structure 320, and silicon dioxide is used as the shallow trench isolation material, silicon nitride and silicon-reacted nitride exhibit a sufficient and appropriate selectivity in subsequent etching processes.

In one embodiment, as shown in FIG. 3a, when the mask layer 360 is substantially comprised of silicon dioxide, an etch stop layer 361, for example, formed of silicon nitride, is formed below the mask layer 360 so as define an end point of a subsequent etching process. A typical process flow for forming the semiconductor device 300, as shown in FIG. 3a, may comprise the following steps. After formation of the shallow trench isolation 302, the P-well structure 310 and the N-well structure 320 are defined by ion implantation, wherein several implantation steps may be used as it is described with reference to FIG. 1a.

In one particular embodiment, the N-well structure 320 is defined by a first implantation with phosphorous ions with an energy of 400-800 keV (kilo electron volts) with a dose of $2\times10^{13}$-$2\times10^{14}$ particles per square centimeter. In a second implantation step, phosphorous ions are implanted into the N-well structure 320 with an energy of 150-250 keV with a dose of $2\times10^{12}$-$5\times10^{13}$ particles per square centimeter, followed by a further phosphorous implantation step with an energy of 50-100 keV with a dose of $2\times10^{12}$-$5\times10^{13}$ particles per square centimeter. Finally, an implantation step with arsenic ions with an energy of 30-70 keV with a dose of $1\times10^{12}$-$1\times10^{13}$ or of phosphorous ions with an energy of 20-50 keV with a dose of $1\times10^{12}$-$1\times10^{13}$ may be performed to coarsely adjust the threshold voltage of the transistor element to be formed in and on the N-well region 320.

In one embodiment, the final threshold implantation may be omitted at this stage of the manufacturing process and may be carried out at a later stage, as will be detailed in the following. Thereafter, a heat treatment may be performed, such as a rapid thermal annealing process, to activate the dopant atoms within the P-well structure 310 and the N-well structure 320 and to cure lattice damage created during the implantation steps. Next, the mask layer 360 and, if required, the etch stop layer 361 are deposited and patterned by conventional photolithography techniques.

FIG. 3b shows the semiconductor device 300 with an epitaxially grown channel layer 350 formed over the N-well structure 320. The channel layer 350 may comprise an undoped semiconductor material, such as silicon, or a slightly doped semiconductor material as is required to obtain the desired retrograde dopant profile after completion of the semiconductor device 300. Moreover, the thickness of the channel layer 350 may be controlled to obtain the desired dopant profile. In illustrative embodiments, the thickness of the channel layer 350 may lie in the range of approximately 10-100 nanometers (nm). According to one particular embodiment, as shown in FIG. 3b, a diffusion barrier layer 351 may be provided between the channel layer 350 and the well structure 320. The diffusion barrier layer 351 is also an epitaxially grown layer, wherein the material composition is selected to substantially match the lattice structure of the underlying semiconductor lattice and also to reduce any diffusion activity of the dopant atoms within the N-well structure 320. In one embodiment, the diffusion barrier layer 351 is substantially comprised of silicon and germanium, wherein the ratio of silicon to germanium is varied so as to yield the required diffusion barrier characteristics for arsenic and phosphorous atoms. Typically, a germanium amount of 1-30% atoms, i.e., 1-30% germanium atoms in the silicon lattice, offers a sufficient degree of hindering the diffusion of arsenic and phosphorous atoms into the overlying channel layer in subsequent heat treatments.

In forming the channel layer 350 and, if required, the diffusion barrier layer 351, process parameters, such as ambient pressure, may be selected such that the crystalline growth of the channel layer 350 and of the diffusion barrier layer 351 is substantially restricted to the surface of the N-well structure 320. Thus, the mask layer 360 and the shallow trench isolation 302 remain substantially uncovered by the channel layer 350 and the diffusion barrier layer 351, except for a minimal overlap caused by the substantially horizontal growth of the layers 350 and 351. Moreover, in the embodiment including the diffusion barrier layer 351, the thickness of the layer 351 may be controlled within a range of approximately 2-20 nm to provide for the required diffusion-reducing property without unduly increasing the number of lattice imperfections owing to the slight mismatch of the lattice constant of the diffusion barrier layer 351 to the overlying and underlying semiconductor lattice.

FIG. 3c shows particular embodiments of the present invention, in which the N-well structure 320 has been recessed prior to the formation of the channel layer 350 and the barrier diffusion layer 351. Recessing the N-well structure may be achieved by well-established etch techniques similar to those used for forming the shallow trench isolations. According to one embodiment, recessing the N-well structure 320 may have been carried out prior to implanting the dopants into the N-well structure 320 so that essentially the same implantation parameters may be used as are described with reference to FIG. 3a. In a further embodiment, the N-well structure 320 is recessed after implanting the dopants and after or before heat treating the semiconductor device 300. In this case, the implantation parameters have accordingly been adapted to create the required dopant concentration at a specified depth of the N-well structure 320 after the N-well structure is recessed. That is, the implantation parameters are modified so as to locate the dopant concentration peak of the individual implantation steps at a depth that is located deeper down the N-well structure 320 to thereby compensate for recessing the N-well structure 320. This may be accomplished by increasing the implantation energy by about 25-300% for a recess depth of approximately 10-100 nm. After recessing the N-well structure 320, the diffusion barrier layer 351, if required, and the channel layer 350 may be grown as is described with reference to FIG. 3b. Recessing the N-well structure 320 prior to forming the epitaxially grown layers 350, 351 provides for a substantially even surface, thereby improving the further processing of the semiconductor device 300.

FIG. 3d shows the semiconductor device 300 with a gate insulation layer 335 formed on the channel layer 350 and the P-well structure 310. Prior to the formation of the gate insulation layer 335, which may be comprised of a semiconductor oxide compound, such as silicon dioxide, the mask layer 360 and, if provided, the etch stop layer 361, are removed by a selective etch process.

According to one embodiment, prior to forming the gate insulation layer 335, a further implantation process may be performed to adjust the threshold voltage of the PMOS transistor to be formed in and over the N-well structure 320. This additional implant step for providing for a sufficient threshold voltage for the PMOS transistor may preferably be used when the gate insulation layer 335 is subsequently formed by a chemical vapor deposition process or by a rapid thermal oxidation process, in which, owing to the reduced temperature and/or the reduced process time compared to a conventional furnace process, up-diffusion of dopant atoms is minimal, so that as a consequence of the minimal up-diffusion during the formation process of the gate insulation layer 335, a required dopant concentration for achieving a desired threshold voltage is not obtained. Accordingly, the additional implant process provides for the appropriate dopant concentration within the channel layer 350 to set the required threshold voltage. In the embodiment that includes the diffusion barrier layer 351, up-diffusion of dopants is minimized, even if a conventional furnace process is employed for forming the gate insulation layer 335. Thus, the threshold voltage may be adjusted by an additional implantation process to locate dopant atoms within the channel layer 350, as indicated by reference number 370. As previously pointed out, during formation of the N-well structure 320, a threshold voltage implantation may or may not have been performed, so that the threshold implantation 370 may be controlled in correspondence to the dopant concentration within the N-well structure 320. That is, the dopant dose during the threshold implantation process to introduce dopant atoms 370 is decreased when a threshold voltage implantation process has initially been performed. On the other hand, the dopant dose is accordingly increased when no such initial threshold voltage implantation process has been performed.

Consequently, the threshold voltage may be adjusted by taking into account the initial dopant concentration in the N-well 320, the presence of the diffusion barrier layer 351 and its corresponding diffusion hindering characteristics, i.e., material composition and thickness, and the characteristics of the channel layer 350, i.e., its initial degree of doping and the thickness.

In one particular embodiment, the formation of the gate insulation layer 335 may be performed in two steps, wherein in the first step the gate insulation layer 335 is formed without removing the mask layer 360, which is preferably comprised of silicon nitride, so that the channel layer 350 receives a first portion of the gate insulation layer 335 (not shown). Then, in the second step, a second portion of the gate insulation layer 335 is formed after removing the mask layer 360 so that the P-well structure 310 receives the gate insulation layer 335 with a thickness that is reduced compared to the thickness of the gate insulation layer 335 provided on the channel layer 350.

In FIG. 3e, the N-well structure 320 has the gate insulation layer 335 with a first thickness 380 that is higher than a second thickness 390 of the gate insulation layer 335 formed over the P-well structure 310. This embodiment is especially advantageous, when two types of transistor elements are present on a single chip area. For example, a thin gate insulation layer 335 is essential for high speed field effect transistors having a short channel length, as is previously described, so that these types of transistor elements are covered by the mask layer 360 to receive the gate insulation layer having the second thickness 390 to thereby ensure the required high performance with respect to fast switching times and high current capability. On the other hand, a transistor element having the gate insulation layer 335 with the first thickness 380 may be a transistor element that needs to exhibit an extremely low leakage current, as is the case in RAM/ROM areas, wherein, preferably, the channel length is increased and an increased gate oxide ensures a minimum leakage current. Thereby, the improved gate insulation layer quality and the increased carrier mobility, due to the reduced dopant concentration in the channel layer 350, provide for significantly improved DC characteristics of the corresponding transistor elements. Thus, low leakage transistor elements, irrespective whether they are P-channel transistors or N-channel transistors, will exhibit improved device performance compared to conventional transistor elements without the retrograde dopant profile in the channel layer 350, wherein simultaneously, high speed transistor elements requiring a thin gate insulation layer may be provided without adding process complexity.

FIG. 3f schematically shows the semiconductor device 300 with a completed N-channel transistor 330 and a completed P-channel transistor 340. The N-channel transistor 330 comprises heavily N-doped source and drain regions 331, including lightly doped extensions 332 within the P-well structure 310. Moreover, a gate electrode 334 is located over the P-well structure 310, separated therefrom by the gate insulation layer 335. Spacer elements 333 are provided at the sidewalls of the gate electrode 334.

The P-channel transistor 340 comprises heavily P-doped source and drain regions 341, including lightly doped extensions 342 within the N-well structure 320. A gate electrode 344 is provided over the channel layer 350 and is separated therefrom by the gate insulation layer 335. Spacer elements 343 are provided at the sidewalls of the gate electrode 344.

Figure 1B:
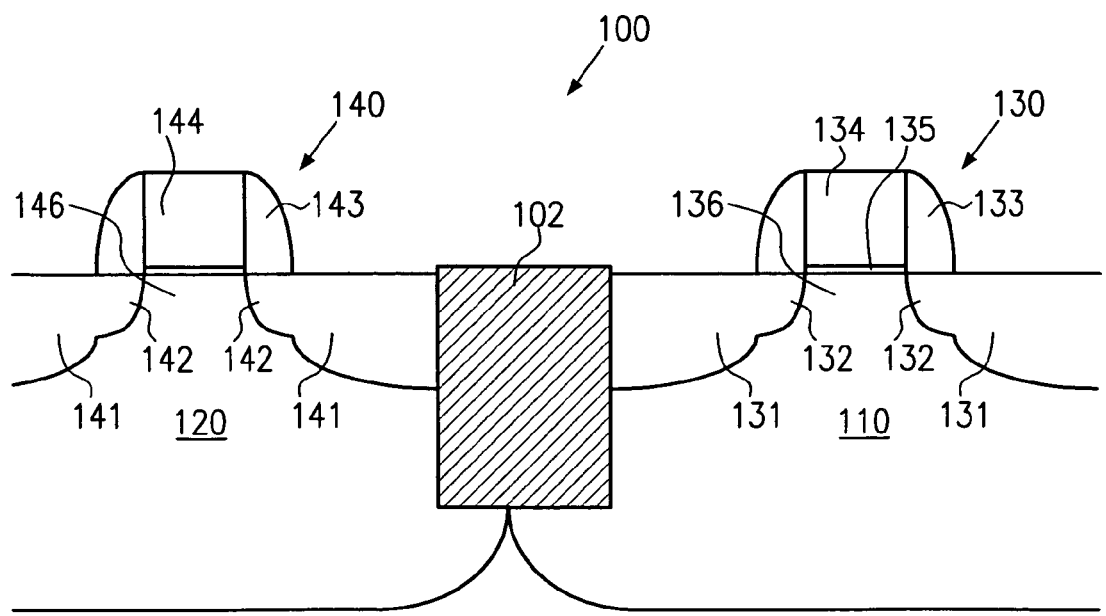

The process flow involved in forming the semiconductor device 300, as depicted in FIG. 3f, may include similar steps as already described with reference to FIGS. 1a-1c. Therefore, a detailed description will be omitted.

According to the illustrative embodiments described with reference to FIGS. 3a-3f, the N-channel transistor 330 comprises a channel region 336 located below the gate insulation layer 335 and between the extensions 332, wherein the channel region 336 exhibits a dopant profile that is similar to a dopant profile as shown in FIG. 2b. That is, the channel region 336 does not substantially exhibit a retrograde dopant profile. In contrast thereto, a channel region 346 within the channel layer 350 may exhibit a dopant concentration as illustrated in FIG. 4.

In FIG. 4, the vertical axis indicated as the "depth" represents the depth in the N-well structure 320, including the channel layer 350. The horizontal axis indicated as "concentration" represents a concentration of the dopant atoms within the N-well structure 320 and the channel layer 350, and possibly the diffusion barrier layer 351. The corresponding thickness of the layers 351 and 350 is indicated by the brackets at the left-hand side of the vertical axis. A curve indicated as 400 represents the dopant concentration of the N-well structure 320 that exhibits the typical "smeared out" distribution as in a conventionally manufactured device. According to a curve 402, the dopant concentration significantly decreases within the diffusion barrier layer 351 and the channel layer 350 towards the gate insulation layer 335. The dopant concentration at the top side of the channel layer 350 may be adjusted by controlling the thickness of the channel layer 350, the initial degree of doping of the channel layer 350, by providing a diffusion barrier layer 351 and the type of composition and layer thickness of the layer 351, and by providing and controlling an additional threshold voltage implantation process, as is previously described. Accordingly, the slope of the concentration curve 402, as well as the minimal concentration at the interface to the gate insulation layer 335, may be adjusted in accordance with design requirements by controlling one or more of the above parameters. A curve 401 represents one alternative dopant concentration within the channel layer 350. Thus, the present invention allows one to provide a retrograde dopant profile in the channel region of a field effect transistor element, wherein the dopant profile may be tailored in correspondence to performance requirements of the field effect transistor element. It should be noted that, although the illustrative embodiments refer to silicon-based semiconductor elements, the principles of the present invention may be readily applied to other semiconductor devices comprising, for example, germanium, or any other III-V or II-VI semiconductors.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A semiconductor device comprising:
   a first transistor element including:
   a well structure formed in a substrate;
   a diffusion barrier layer formed on said well structure;
   a channel layer formed on said diffusion barrier layer;
   a gate insulation layer formed on the channel layer;
   a gate electrode formed on said gate insulation layer;
   a source region and a drain region formed in said well structure and separated by a channel region,
   wherein a dopant concentration in the channel region decreases from the gate insulation layer towards the diffusion barrier layer.

2. The semiconductor device of claim 1, wherein the diffusion barrier layer comprises silicon and germanium.

3. The semiconductor device of claim 2, wherein approximately 1-30% germanium atoms are provided in the diffusion barrier layer.

4. The semiconductor device of claim 1, wherein a thickness of the channel layer is in the range of approximately 10-100 nanometers.

5. The semiconductor device of claim 1, wherein a thickness of the diffusion barrier layer is in the range of approximately 2-20 nanometers.

6. The semiconductor device of claim 1, wherein the first transistor element is at least one of a P-channel transistor, an N-channel transistor, a high speed short channel transistor and a low leakage transistor.

7. The semiconductor device of claim 1, further comprising a second transistor element.

8. The semiconductor device of claim 7, wherein a gate insulation layer of the second transistor element has a thickness that is less than a thickness of the gate insulation layer of the first transistor element.

9. The semiconductor device of claim 7, wherein the second transistor element is at least one of a P-channel transistor, an N-channel transistor, a high speed short channel transistor and a low leakage transistor.

10. The semiconductor device of claim 7, further comprising a first die area and a second die area, the first die area containing a plurality of first transistor elements and the second die area containing a plurality of second transistor elements, wherein the second transistor elements each have a thinner gate insulation layer than each of the first transistor elements.

11. The semiconductor device of claim 7, wherein the first and the second transistor elements form a complementary MOS pair, with the first transistor element being the P-channel transistor.

* * * * *